(12) United States Patent
Choi

(10) Patent No.: US 11,423,986 B2
(45) Date of Patent: Aug. 23, 2022

(54) SEMICONDUCTOR MEMORY DEVICE AND METHOD OF OPERATING THE SEMICONDUCTOR MEMORY DEVICE

(71) Applicant: SK hynix Inc., Icheon-si Gyeonggi-do (KR)

(72) Inventor: Hyung Jin Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/160,015

(22) Filed: Jan. 27, 2021

(65) Prior Publication Data

US 2022/0036950 A1 Feb. 3, 2022

(30) Foreign Application Priority Data

Jul. 29, 2020 (KR) .................. 10-2020-0094761

(51) Int. Cl.
| | |
|---|---|
| *G11C 16/04* | (2006.01) |
| *G11C 16/26* | (2006.01) |
| *G11C 16/34* | (2006.01) |
| *G11C 16/24* | (2006.01) |
| *G11C 16/10* | (2006.01) |

(52) U.S. Cl.
CPC .......... *G11C 16/0483* (2013.01); *G11C 16/10* (2013.01); *G11C 16/24* (2013.01); *G11C 16/26* (2013.01); *G11C 16/3459* (2013.01)

(58) Field of Classification Search
CPC ..... G11C 16/0483; G11C 16/10; G11C 16/24; G11C 16/26; G11C 16/3459
See application file for complete search history.

(56) References Cited

U.S. PATENT DOCUMENTS

2006/0285391 A1* 12/2006 Cernea ................ G11C 11/5642
365/185.22
2021/0090661 A1* 3/2021 Sako .................. G11C 16/3481

FOREIGN PATENT DOCUMENTS

KR 1020130072668 A 7/2013
KR 101929614 B1 12/2018

* cited by examiner

*Primary Examiner* — Uyen Smet
(74) *Attorney, Agent, or Firm* — William Park & Associates Ltd.

(57) ABSTRACT

Provided herein is a semiconductor memory device and a method of operating the semiconductor memory device. The semiconductor memory device includes: a memory cell array comprising a plurality of memory cells to be programmed to a plurality of programmed states; a peripheral circuit configured to perform a program operation on selected memory cells among the plurality of memory cells; a current sensing circuit configured to perform an individual state current sensing operation and an overall state current sensing operation on selected memory cells among the memory cells and determine a result of the program operation on each for the plurality of programmed states; and control logic configured to control the peripheral circuit and the current sensing circuit such that an operation period of the overall state current sensing operation at least partially overlaps with an operation period of a bit line set-up operation of the program operation.

19 Claims, 14 Drawing Sheets

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2020-0094761 filed on Jul. 29, 2020, in the Korean Intellectual Property Office, the entire disclosure of which is incorporated by reference herein.

BACKGROUND

1. Technical Field

Various embodiments of the present disclosure generally relate to an electronic device, and more particularly, to a semiconductor memory device and a method of operating the semiconductor memory device.

2. Related Art

Recently, the paradigm for the computer environment has been converted into ubiquitous computing so that computer systems can be used anytime and anywhere. Thereby, the use of portable electronic devices such as mobile phones, digital cameras, and notebook computers has rapidly increased. In general, such portable electronic devices use a memory system which employs a semiconductor memory device, in other words, use a data storage device. The data storage device is used as a main memory device or an auxiliary memory device of the portable electronic devices.

A data storage device using a semiconductor memory device provides advantages in that, since there is no mechanical driving component, stability and durability are excellent, an information access speed is increased, and power consumption is reduced. Examples of a data storage device proposed as the memory system having such advantages may include a universal serial bus (USB) memory device, a memory card having various interfaces, and a solid state drive (SSD).

Semiconductor memory devices are classified into a volatile memory device and a nonvolatile memory device.

Although read and write speeds are comparatively low, the nonvolatile memory device can retain data stored therein even when power supply is interrupted. Therefore, the nonvolatile memory device is used when there is the need for storing data which must be maintained regardless of supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

An embodiment of the present disclosure may provide for a semiconductor memory device including: a memory cell array comprising a plurality of memory cells to be programmed to a plurality of programmed states; a peripheral circuit configured to perform a program operation on selected memory cells among the plurality of memory cells; a current sensing circuit configured to perform an individual state current sensing operation and an overall state current sensing operation on selected memory cells among the memory cells and determine a result of the program operation for each of the plurality of programmed states; and a control logic configured to control the peripheral circuit and the current sensing circuit such that an operation period of the overall state current sensing operation at least partially overlaps with an operation period of a bit line set-up operation of the program operation.

An embodiment of the present disclosure may provide for a method of operating a semiconductor memory device, including: performing a first program operation corresponding to a first programmed state of a plurality of programmed states; performing a first individual current sensing operation corresponding to the first program operation and determining whether the first program operation has passed; performing a second program operation corresponding to a second programmed state having a threshold voltage distribution higher than a threshold voltage distribution of the first programmed state based on a result of the first individual current sensing operation; performing a second individual current sensing operation corresponding to the second program operation and determining whether the second program operation has passed; performing an overall state current sensing operation; and performing, when a result of the overall state current sensing operation indicates a fail, an additional program operation and then re-performing the process from the overall state current sensing operation. The overall state current sensing operation and an operation period of the additional program operation may at least partially overlap with each other.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure may be directed to a semiconductor memory device capable of reducing a program operation time, and a method of operating the semiconductor memory device.

Figure 1:
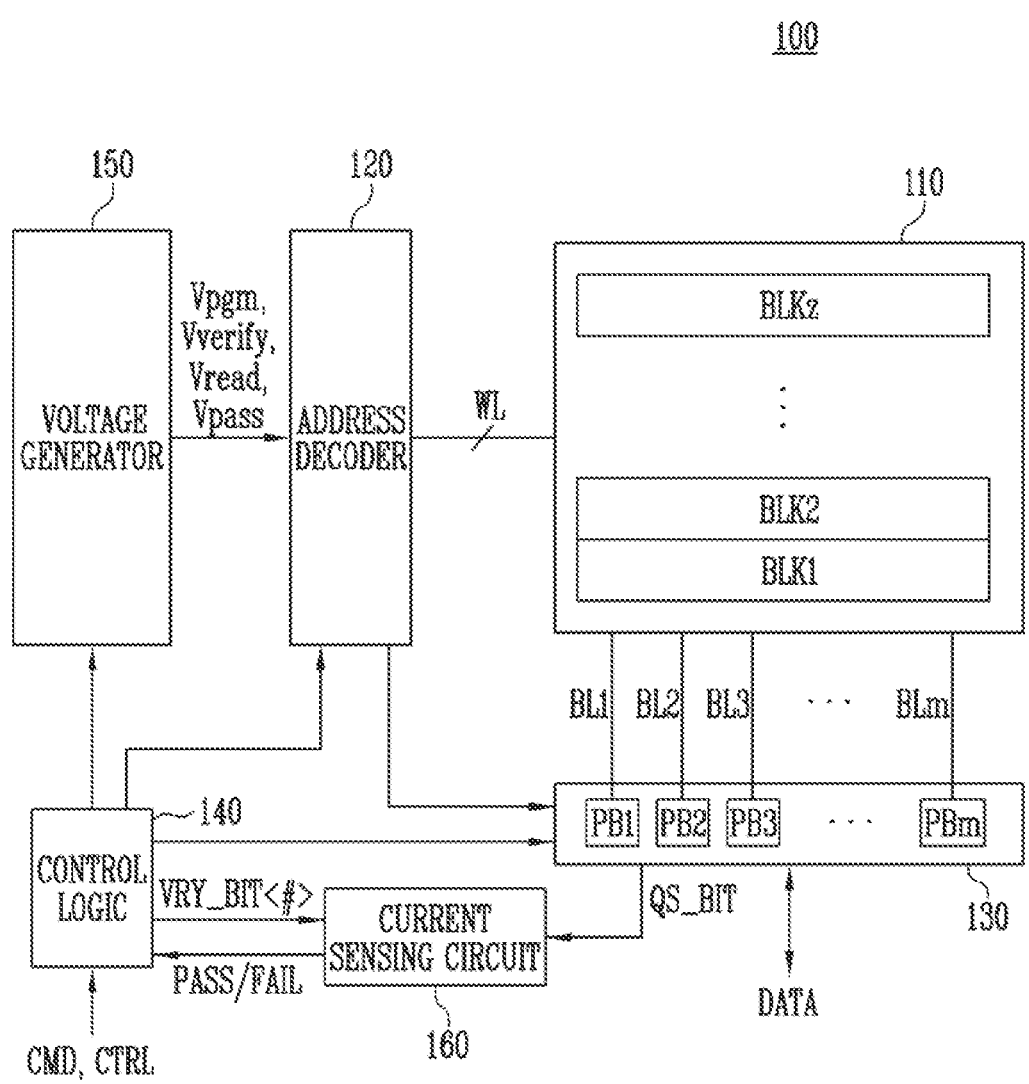
FIG. 1 is a block diagram illustrating a semiconductor memory device in accordance with an embodiment of the present disclosure.

FIG. 1 is a block diagram illustrating a semiconductor memory device 100 in accordance with an embodiment of the present disclosure.

Referring to FIG. 1, the semiconductor memory device 100 may include a memory cell array 110, an address decoder 120, a read/write circuit 130, control logic 140, a voltage generator 150, and a current sensing circuit 160. The control logic 140 may be implemented as hardware, software, or a combination of hardware and software. For example, the control logic 140 may be a control logic circuit operating in accordance with an algorithm and/or a processor executing control logic code.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure. Each of the memory cells included in the memory cell array may store at least one bit of data. In an embodiment, each of the memory cells included in the memory cell array 110 may be a single-level cell (SLC), which may store 1-bit data. In an embodiment, each of the memory cells included in the memory cell array 110 may be a multi-level cell (MLC), which may store 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In various embodiments, the memory cell array 110 may include a plurality of memory cells each of which may store 5 or more bits of data.

The address decoder 120 may be coupled to the memory cell array 110 through the word lines WL. The address decoder 120 may operate under control of the control logic 140. The address decoder 120 may receive addresses through an input/output buffer (not shown) provided in the semiconductor memory device 100.

The address decoder 120 may decode a block address among the received addresses. The address decoder 120 may select at least one memory block based on the decoded block address. Furthermore, the address decoder 120 may apply a program voltage Vpgm generated from the voltage generator 150 to a selected word line of a selected memory block during a program pulse application operation of a program operation, and apply a pass voltage Vpass to the other unselected word lines. During a program verify operation, the address decoder 120 may apply a verify voltage Vverify generated from the voltage generator 150 to a selected word line of a selected memory block, and apply a pass voltage Vpass to the other unselected word lines. During a read voltage application operation of a read operation, the address decoder 120 may apply a read voltage Vread generated from the voltage generator 150 to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The program operation and the read operation of the semiconductor memory device 100 may be performed on a page basis. Addresses received in a request for a program operation or a read operation may include a block address, a row address and a column address. The address decoder 120 may select one memory block and one word line based on the block address and the row address. The column address may be decoded by the address decoder 120 and provided to the read/write circuit 130. In the present specification, memory cells coupled to one word line may be designated as one "physical page".

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm.

Each of the page buffers PB1 to PBm may temporarily store data DATA received from an external device and to be programmed during the program operation, and control a potential level of a corresponding one of the bit lines BL1 to BLm based on the temporarily stored data DATA.

During a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a programmed state of a corresponding memory cell and latch it as sensing data. The page buffers PB1 to PBm may generate a verify data bit QS_BIT using the temporarily stored data DATA to be programmed and the latched sensing data.

The read/write circuit 130 may be operated in response to page buffer control signals output from the control logic 140.

The control logic 140 may be coupled to the address decoder 120, the read/write circuit 130, the voltage generator 150, and a current sensing circuit 160. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL.

The control logic 140 may control a peripheral circuit to successively program a plurality of memory cells to a plurality of programmed states during a program operation, and control a current sensing circuit 160 to perform program loops corresponding to a one target programmed state and then perform an individual state current sensing operation for a specific target programmed state. Furthermore, the control logic 140 may count the number of times program loops have been performed during a program operation, and control the current sensing circuit 160 to perform an overall state current sensing operation for the overall target programmed states when the number of times the program loops have been performed is a set count or more.

The control logic 140 may determine whether a program operation for a specific target programmed state or overall target programmed states has passed or failed, in response to a pass signal PASS or a fail signal FAIL received from the current sensing circuit 160.

The control logic 140 in accordance with an embodiment of the present disclosure may control the current sensing circuit 160 and the read/write circuit 130 such that, during a program operation, a bit line set-up operation of a page buffer and an overall state current sensing operation to be performed to determine whether program operations for all programmed states have passed overlap with each other.

In response to a control signal output from the control logic 140, the voltage generator 150 may generate a program voltage Vpgm and a pass voltage Vpass during a program pulse application operation of a program operation, and generate a verify voltage Vverify and a pass voltage Vpass during a program verify operation of the program operation. Furthermore, the voltage generator 150 may generate a read voltage Vread and a pass voltage Vpass during a read operation.

The current sensing circuit 160 may generate reference current in response to an enable bit VRY_BIT<#> received from the control logic 140 during a current sensing operation, and generate a reference voltage based on the reference current. The current sensing circuit 160 may generate verify current based on a verify data bit QS_BIT received from the page buffers PB1 to PBm included in the read/write circuit 130, and generate a verify voltage based on the verify current. The current sensing circuit 160 may compare the reference voltage and the verify voltage and output a pass signal PASS or a fail signal FAIL.

For example, the current sensing circuit 160 may generate the verify current and the verify voltage using the verify data bit QS_BIT based on a value of verify data stored in a sub-latch circuit included in each of the page buffers PB1 to PBm during the individual state current sensing operation or the overall state current sensing operation, compare the generated verify voltage with the reference voltage generated based on the reference current, and determine whether a program operation corresponding to a specific target programmed state has passed, or a program operation corresponding to overall target programmed states has passed.

For example, when, during an individual state current sensing operation, the number of program-failed memory cells among m memory cells to be programmed to a specific programmed state is a preset number or less, the current sensing circuit 160 may determine that the program operation for the specific programmed state has passed, and output a pass signal PASS. When, during the individual state current sensing operation, the number of program-failed memory cells among m memory cells to be programmed to a specific programmed state is greater than a preset number, the current sensing circuit 160 may determine that the program operation for the specific programmed state has failed, and output a fail signal FAIL.

Furthermore, when, during an overall state current sensing operation, the number of program-failed memory cells among n memory cells to be programmed to a plurality of programmed states (e.g., among memory cells included in one page) is a preset number or less, the current sensing circuit 160 may determine that the program operation for the overall programmed states has passed, and output a pass signal PASS. When, during the overall state current sensing operation, the number of program-failed memory cells among n memory cells to be programmed to the overall programmed states is greater than a preset number, the current sensing circuit 160 may determine that the program operation for the overall programmed states has failed, and output a fail signal FAIL.

The address decoder 120, the read/write circuit 130, and the voltage generator 150 may function as "peripheral circuit" for performing a read operation, a program operation, or an erase operation on the memory cell array 110. The peripheral circuit may perform a read operation, a program operation, or an erase operation on the memory cell array 110 under control of the control logic 140.

Figure 2:
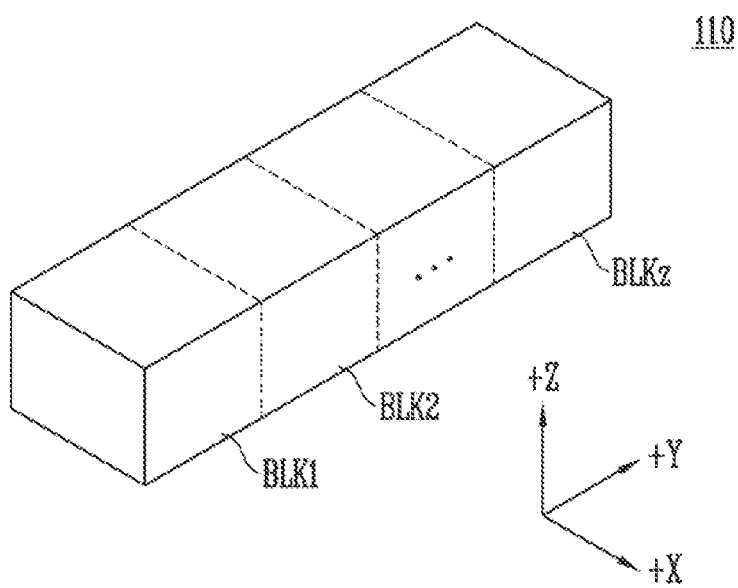
FIG. 2 is a diagram illustrating a memory cell array of FIG. 1, in accordance with an embodiment of the present disclosure.

FIG. 2 is a diagram illustrating the memory cell array 110 of FIG. 1, in accordance with an embodiment of the present disclosure.

Referring to FIG. 2, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described with reference to FIGS. 3 and 4.

Figure 3:
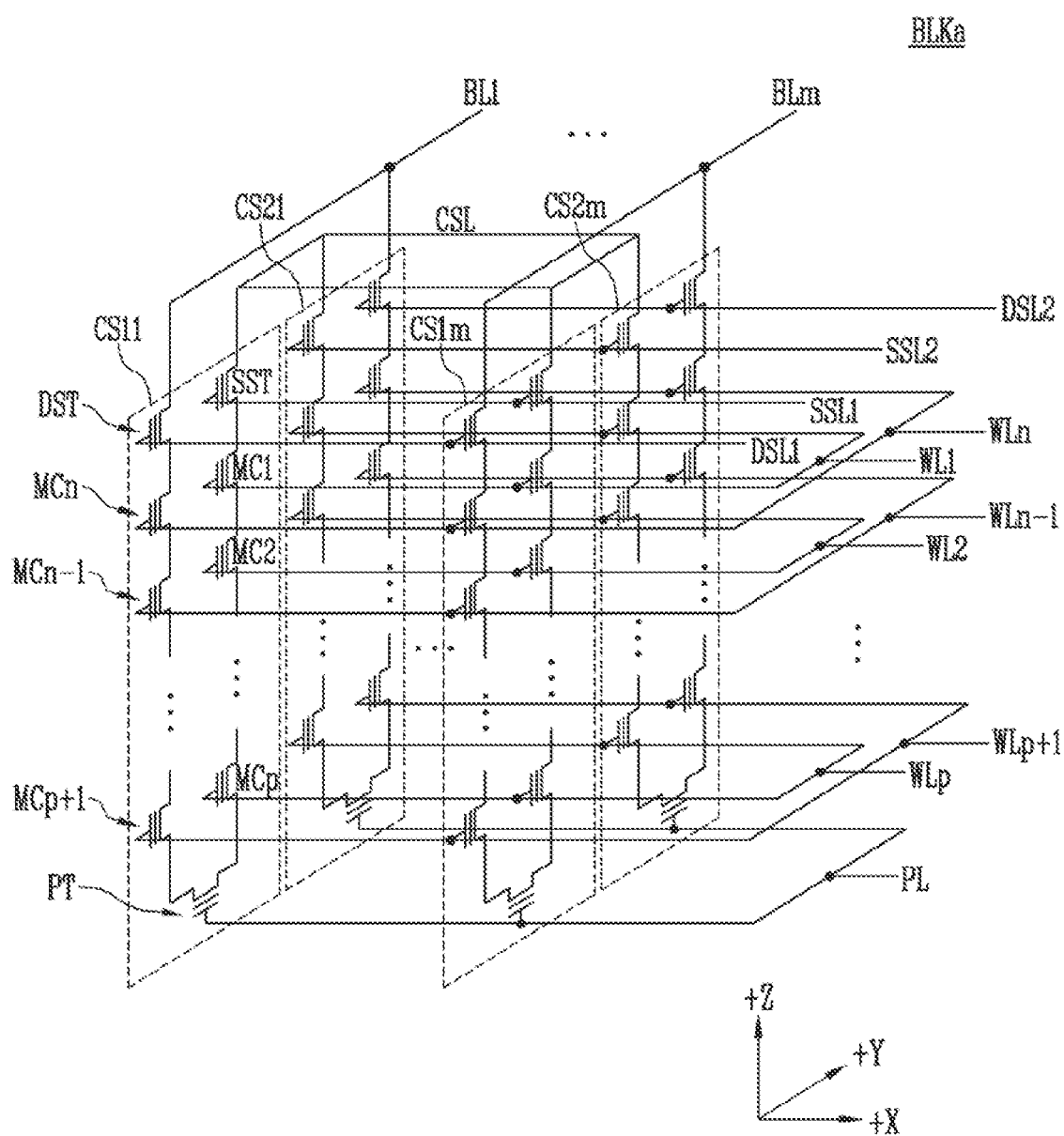
FIG. 3 is a circuit diagram illustrating any one memory block BLKa of memory blocks BLK1 to BLKz of FIG. 2, in accordance with an embodiment of the present disclosure.

FIG. 3 is a circuit diagram illustrating any one memory block BLKa of the memory blocks BLK1 to BLKz of FIG. 2, in accordance with an embodiment of the present disclosure.

Referring to FIG. 3, the memory block BLKa may include a plurality of cell strings CS11 to CS1m and CS21 to CS2m. In an embodiment, each of the cell strings CS11 to CS1m and CS21 to CS2m may be formed in a "U" shape. In the memory block BLKa, m cell strings may be arranged in a row direction (i.e., the +X direction). In FIG. 3, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 3, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2$m$ in the second row are coupled to a second drain select line DSL2.

Cell strings arranged in the column direction may be coupled to bit lines extending in the column direction. In FIG. 3, cell strings CS11 and CS21 in a first column are coupled to a first bit line BL1. Cell strings CS1$m$ and CS2$m$ in an m-th column are coupled to an m-th bit line BL$m$.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BL$m$. Even-number-th cell strings of the cell strings CS11 to CS1$m$ or CS21 to CS2$m$ arranged in the row direction may be coupled to respective even bit lines. Odd-number-th cell strings of the cell strings CS11 to CS1$m$ or CS21 to CS2$m$ arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 4:
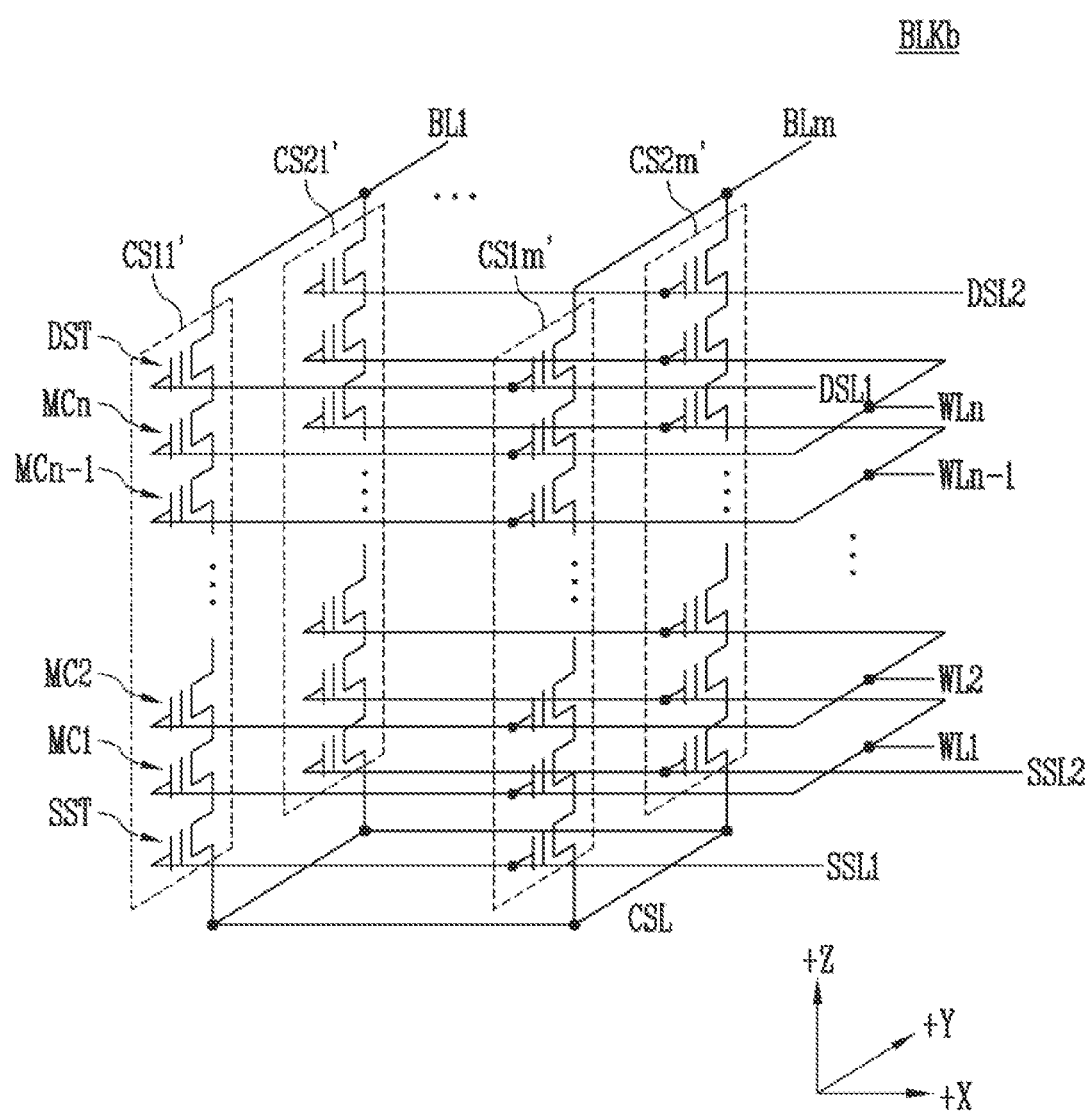
FIG. 4 is a circuit diagram illustrating any one memory block BLKb of the memory blocks BLK1 to BLKz of FIG. 2, in accordance with an embodiment of the present disclosure.

FIG. 4 is a circuit diagram illustrating any one memory block BLKb of the memory blocks BLK1 to BLKz of FIG. 2, in accordance with an embodiment of the present disclosure.

Referring to FIG. 4, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1$m$' arranged in a first row may be coupled to a first source select line SSL1. Source select transistors of the cell strings CS21' to CS2$m$' arranged in a second row may be coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1$m$' in the first row are coupled to a first drain select line DSL1. Drain select transistors of the cell strings CS21' to CS2$m$' in the second row may be coupled to a second drain select line DSL2.

Consequently, the memory block BLKb of FIG. 4 may have an equivalent circuit similar to that of the memory block BLKa of FIG. 3 except that a pipe transistor PT is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
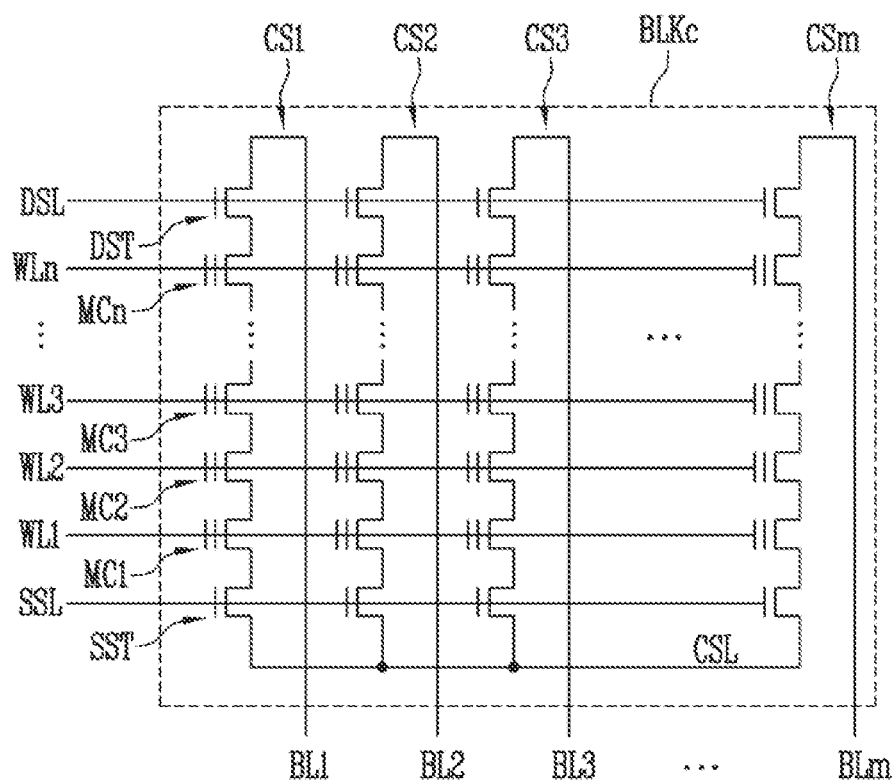
FIG. 5 is a circuit diagram illustrating any one memory block BLKc of the memory blocks BLK1 to BLKz included in the memory cell array 110 of FIG. 1 in accordance with an embodiment of the present disclosure.

FIG. 5 is a circuit diagram illustrating any one memory block BLKc of the memory blocks BLK1 to BLKz included in the memory cell array 110 of FIG. 1 in accordance with an embodiment of the present disclosure.

Referring to FIG. 5, the memory block BLKc may include a plurality of cell strings CS1 to CSm. The plurality of cell strings CS1 to CSm may be respectively coupled to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

Memory cells coupled to the same word line may form a single page. The cell strings CS1 to CSm may be selected by selecting the drain select line DSL. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number-th cell strings of the cell strings CS1 to CSm may be coupled to the respective even bit lines, and odd-number-th cell strings may be coupled to the respective odd bit lines.

As described above, memory cells coupled to one word line may form one physical page. In an embodiment of FIG. 5, among the memory cells that belong to the memory block BLKc, m memory cells coupled to any one word line of a plurality of word lines WL1 to WLn may form one physical page.

As illustrated in FIGS. 2 to 4, the memory cell array 110 of the semiconductor memory device 100 may have a three-dimensional structure, but the memory cell array 110 may have a two-dimensional structure, as illustrated in FIG. 5.

Figure 6:
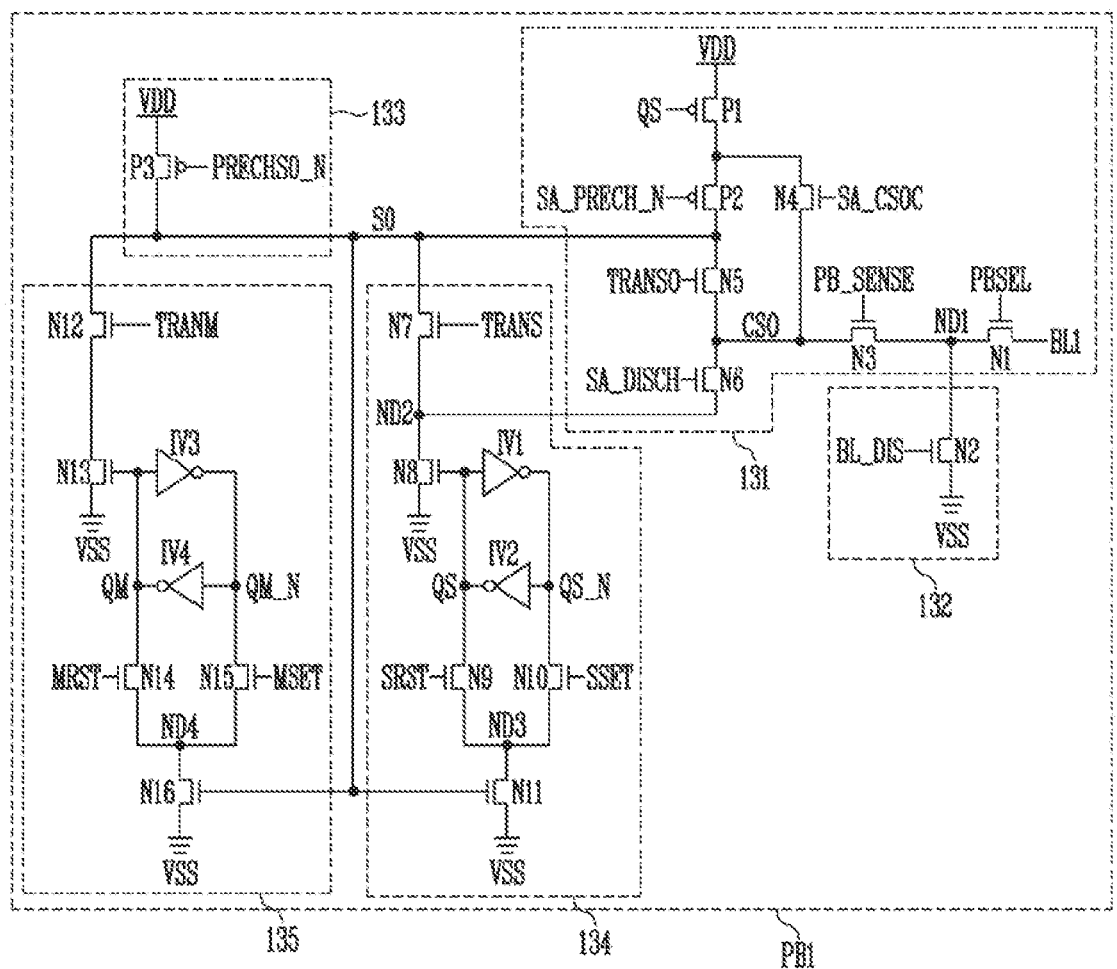
FIG. 6 is a circuit diagram for describing a page buffer of FIG. 1.

FIG. 6 is a circuit diagram for describing a page buffer of FIG. 1.

Each of the page buffers PB1 to PBm of FIG. 1 may have a similar structure, and the page buffer PB1 will be described as a representative example for the sake of explanation.

Referring to FIG. 6, the page buffer PB1 may include a bit line controller 131, a bit line discharger 132, a sensing node precharger 133, a sub-latch circuit 134, and a main latch circuit 135.

During the bit line set-up operation of the program operation, the bit line controller 131 may control the potential level of the bit line BL1 to a program enable level or a program inhibit level based on the potential of a node QS of the sub-latch circuit 134. Furthermore, during a sensing operation of the read operation or the verify operation, the bit line controller 131 may control the potential level of a sensing node SO based on the amount of current of the bit line BL1 that varies depending on a programmed state of a memory cell coupled to the bit line BL1.

The bit line controller 131 may include a plurality of NMOS transistors N1 and N3 to N6, and a plurality of PMOS transistors P1 and P2.

The NMOS transistor N1 may be coupled between the bit line BL1 and a node ND1 and electrically couple the bit line BL1 and the node ND1 in response to a page buffer select signal PBSEL.

The NMOS transistor N3 may be coupled between the node ND1 and a common sensing node CSO and electrically couple the node ND1 and the common sensing node CSO in response to a page buffer sensing signal PB_SENSE.

The PMOS transistor P1 and the PMOS transistor P2 may be coupled in series between a power voltage VDD and the sensing node SO, and may be respectively turned on in response to a potential of a node QS of the sub-latch circuit 134 and a precharge signal SA_PRECH_N.

The NMOS transistor N4 may be coupled between the common sensing node CSO and a node between the PMOS transistor P1 and the PMOS transistor P2, and supply the power voltage VDD supplied through the PMOS transistor P1, to the common sensing node CSO in response to a control signal SA_CSOC.

The NMOS transistor N5 may be coupled between the sensing node SO and the common sensing node CSO and electrically couple the sensing node SO and the common sensing node CSO in response to a transmission signal TRANSO.

The NMOS transistor N6 may be coupled between the common sensing node CSO and a node ND2 of the sub-latch circuit 134 and electrically couple the common sensing node CSO and the node ND2 in response to a discharge signal SA_DISCH.

The operation of the bit line controller 131 during the bit line set-up operation will be described below.

The PMOS transistor P1 may be turned on or off based on the potential of the node QS of the sub-latch circuit 134. The node QS may be controlled in potential based on data to be programmed or verify data sensed after a verify operation. For example, in the case where data that is latched to the sub-latch circuit 134 and is to be programmed corresponds to an erased state, or verify data corresponding to a program pass condition as a result of the verify operation is latched to the sub-latch circuit 134, the node QS may have a logic high level, and the PMOS transistor P1 may be turned off in response to the potential of the node QS. On the other hand, in the case where data that is latched to the sub-latch circuit 134 and is to be programmed corresponds to any one of a plurality of programmed states, or verify data corresponding to a program fail condition as a result of the verify operation is latched to the sub-latch circuit 134, the node QS may have a logic low level, and the PMOS transistor P1 may be turned on in response to the potential of the node QS.

The NMOS transistor N4 may be turned on in response to a control signal SA_CSOC. The NMOS transistor N3 may be turned on in response to a page buffer sensing signal PB_SENSE. The NMOS transistor N1 may be turned on in response to a page buffer select signal PBSEL. Hence, the bit line BL1 may be controlled to a program enable level (e.g., a ground voltage level) or a program inhibit level (e.g., a power voltage level) based on the potential of the node QS of the sub-latch circuit 134.

The operation of the bit line controller 131 during the sensing operation will be described below.

The PMOS transistor P1 and the PMOS transistor P2 may precharge the sensing node SO to the level of the power voltage VDD in response to the node QS of the sub-latch circuit 134 set to a logic low level and the precharge signal SA_PRECH_N having a logic low level.

The NMOS transistor N4 may be turned on in response to a control signal SA_CSOC. The NMOS transistor N5 may be turned on in response to a transmission signal TRANSO having a logic high level. The common sensing node CSO may be precharged to a predetermined level VDD-Vth. The word "predetermined" as used herein with respect to a parameter, such as a predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Thereafter, an evaluation operation may be performed from a time point at which the precharge signal SA_PRECH_N makes a transition to a logic high level to a time point at which the transmission signal TRANSO makes a transition to a logic low level. The PMOS transistor P2 may be turned off in response to the precharge signal SA_PRECH_N that has made a transition to the logic high level, and the power voltage VDD that has been applied to the sensing node SO may be interrupted. The potential levels of the sensing node SO and the common sensing node CSO may vary depending on the programmed state of the memory cell coupled with the bit line BL1. For example, in the case of a programmed state in which the threshold voltage of the memory cell is higher than a read voltage or a verify voltage to be applied to a word line of the memory cell during a read operation or a verify operation, current does not flow through the bit line BL1. Hence, the potentials of the common sensing node CSO and the sensing node SO may remain at a precharge level. On the other hand, in the case of a programmed state in which the threshold voltage of the memory cell is lower than the read voltage or the verify voltage to be applied to the word line of the memory cell during the read operation or the verify operation, current flows through the bit line BL1. Hence, the potentials of the common sensing node CSO and the sensing node SO may be reduced from the precharged state by a discharge level (e.g., SA_CSOC-Vth).

The bit line discharger 132 may be coupled to the node ND1 of the bit line controller 131 and discharge the potential level of the bit line BL1.

The bit line discharger 132 may include an NMOS transistor N2 coupled between the node ND1 and the ground voltage VSS. The NMOS transistor N2 may apply the ground voltage VSS to the node ND1 in response to a bit line discharge signal BL_DIS.

The sensing node precharger 133 may be coupled between the sensing node SO and the power voltage VDD and precharge the sensing node SO to the level of the power voltage VDD.

The sensing node precharger 133 may include a PMOS transistor P3. The PMOS transistor P3 may apply the power voltage VDD to the sensing node SO in response to a sensing node precharge signal PRECHSO_N.

The sub-latch circuit 134 may include a plurality of NMOS transistors N7 to N11 and inverters IV1 and IV2.

The inverters IV1 and IV2 may be coupled in reverse parallel between the node QS and a node QS_N and form a latch.

The NMOS transistor N7 and the NMOS transistor N8 may be coupled in series between the sensing node SO and the ground voltage VSS. The NMOS transistor N7 may be turned on in response to a transmission signal TRANS. The NMOS transistor N8 may be turned on or turned off depending on the potential level of the node QS.

The NMOS transistor N9 may be coupled between the node QS and a node ND3 and electrically couple the node QS with the node ND3 in response to a reset signal SRST. The NMOS transistor N10 may be coupled between the node QS_N and the node ND3 and electrically couple the node QS_N with the node ND3 in response to a set signal SSET. The NMOS transistor N11 may be coupled between the node ND3 and the ground voltage VSS and be turned on depending on the potential of the sensing node SO to electrically couple the node ND3 with the ground voltage VSS. For example, in the case where a reset signal SRST having a logic high level is applied to the NMOS transistor N9 while the sensing node SO is precharged to a high level, the node QS and the node QS_N may be respectively initialized to a logic low level and a logic high level. Furthermore, in the case where a set signal SSET having a logic high level is applied to the NMOS transistor N10 while the sensing node SO is precharged to a high level, the node QS and the node QS_N may be respectively set to a logic high level and a logic low level.

During a verify operation of a program operation, the sub-latch circuit 134 may latch verify data. For example, during the verify operation, if the potential level of the sensing node SO is changed by the bit line controller 131, the sub-latch circuit 134 may generate verify data based on the potential level of the sensing node SO and latch the verify data. For example, if the threshold voltage of a target memory cell coupled to the bit line BL1 is lower than the verify voltage, the target memory cell may be turned on, so that the potential level of the sensing node SO may be discharged. If the threshold voltage of the target memory cell coupled to the bit line BL1 is higher than the verify voltage, the target memory cell may be turned off, so that the potential level of the sensing node SO may remain at the precharge level (the power voltage level). The NMOS transistor N9 may be turned on in response to a reset signal SRST, and the NMOS transistor N11 may be turned off or turned on based on the potential level of the sensing node SO so that the sub-latch circuit 134 may latch verify data. For example, in the case where the sub-latch circuit 134 latches verify data corresponding to a fail condition as a result of a verify operation, the node QS may have a logic high level. In the case where the sub-latch circuit 134 latches verify data corresponding to a pass condition as a result of the verify operation, the node QS may have a logic low level.

During a current sensing operation after the verify operation, the sub-latch circuit 134 may transmit the latched verify data to the sensing node SO. During the current sensing operation, verify data transmitted to the sensing node SO by each of the plurality of page buffers PB1 to PBm may be transmitted to the current sensing circuit 160 as the verify data bit QS_BIT of FIG. 1.

The main latch circuit 135 may include a plurality of NMOS transistors N12 to N16 and inverters IV3 and IV4.

The inverters IV3 and IV4 may be coupled in reverse parallel between a node QM and a node QM_N and form a latch.

The NMOS transistor N12 and the NMOS transistor N13 may be coupled in series between the sensing node SO and the ground voltage VSS. The NMOS transistor N12 may be turned on in response to a transmission signal TRANM. The NMOS transistor N13 may be turned on or turned off depending on the potential level of the node QM.

The NMOS transistor N14 may be coupled between the node QM and the node ND4. The NMOS transistor N14 may be turned on or turned off in response to a reset signal MRST. The NMOS transistor N15 may be coupled between the node QM_N and the node ND4 and electrically couple the node QM_N with the node ND4 in response to a set signal MSET. The NMOS transistor N16 may be coupled between the node ND4 and the ground voltage VSS and couple the node ND4 with the ground voltage VSS depending on the potential of the sensing node SO.

Figure 7:
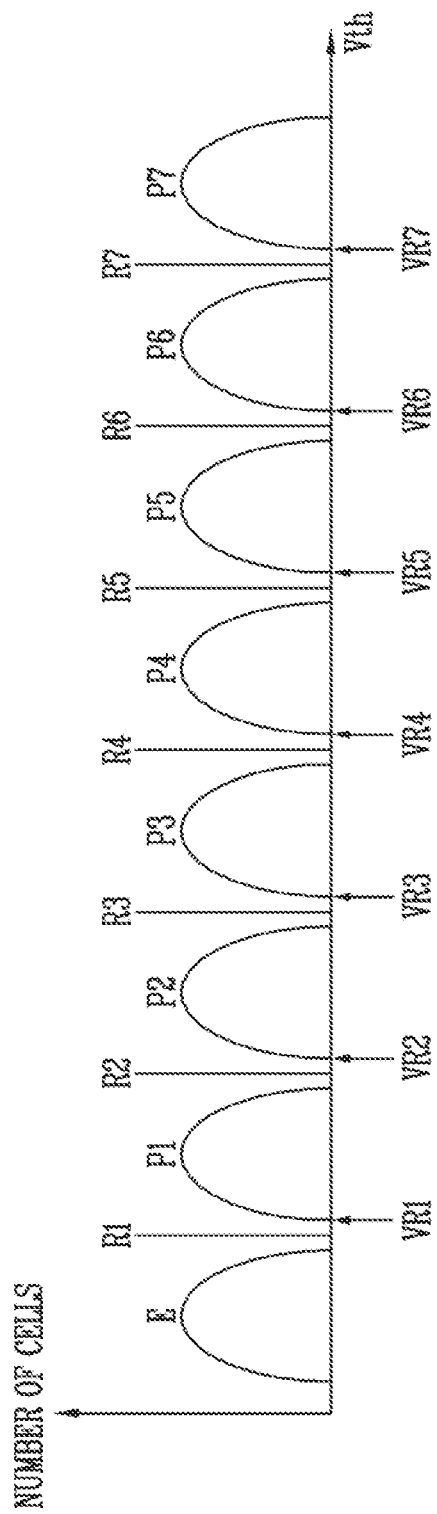
FIG. 7 is a graph illustrating programmed states of a triple-level cell.

FIG. 7 is a graph illustrating programmed states of a triple-level cell.

Referring to FIG. 7, a triple-level cell (TLC) may have threshold voltage states respectively corresponding to one erased state E and seven programmed states P1 to P7. The erased state E and the first to seventh programmed states P1 to P7 each may have a corresponding bit code. As needed, various bit codes may be allocated to the erased state E and the first to seventh programmed states P1 to P7.

The threshold voltage states may be divided from each other based on first to seventh read voltages R1 to R7. Furthermore, first to seventh verify voltages VR1 to VR7 may be used to determine whether memory cells corresponding to each programmed state have been programmed.

For example, to verify memory cells corresponding to the second programmed state P2 among memory cells included in a selected physical page, a second verify voltage VR2 may be applied to a corresponding word line. Here, the page buffer PB1 illustrated in FIG. 6 may sense the current of the bit line BL1 to determine whether a target memory cell coupled to the bit line BL1 is in a program-uncompleted state or a program-completed state.

When the second verify voltage VR2 is applied to the word line and the operation of sensing the bit line BL is performed, if the threshold voltage of the target memory cell is less than the second verify voltage VR2, the node QS of the sub-latch circuit 134 may remain at the logic high level. If the threshold voltage of the target memory cell is greater than the second verify voltage VR2, the node QS of the sub-latch circuit 134 may be changed to a logic low level. During a subsequent program loop, a program inhibit voltage is applied to the bit line BL1 coupled with the target memory cell. Therefore, even if a program pulse is applied to the word line, the threshold voltage of the target memory cell is no longer increased.

An operation of determining whether a program operation on memory cells to be programmed to the second programmed state P2 has been completed, i.e., an operation of determining whether the program operation has passed or failed, may be performed by the current sensing circuit 160 of FIG. 1.

In an example of FIG. 1, the current sensing circuit 160 may determine whether a program operation has passed or failed, by comparing a reference voltage based on reference current corresponding to the number of memory cells to be programmed to the second programmed state P2 with a verify voltage based on a verify data bit QS_BIT corresponding to the number of memory cells having a threshold voltage greater than the verify voltage VR2 among the memory cells to be programmed to the second programmed state P2. In other words, the current sensing circuit 160 may determine whether the program operation for the second programmed state P2 has passed or faded, by comparing the number of program-passed memory cells among the memory cells to be programmed to the second programmed state P2 with a preset number. The word "preset" as used herein with respect to a parameter, such as a preset number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

As described above, the current sensing circuit 160 may determine whether the program operation for a specific programmed state (e.g., P2) has passed/failed. Hereinafter, in the entirety of this specification, an operation of determining whether a program operation for a specific programmed state among a plurality of programmed states has passed/failed will be referred to as "individual state current sensing operation". During the individual state current sensing operation, it is determined whether a program operation on memory cells to be programmed to a specific programmed state has been completed.

On the other hand, an operation of determining whether a verify operation for overall programmed states P1 to P7 has passed/failed will be referred to as "overall state current sensing operation". During the overall state current sensing operation, it is determined whether an overall program operation has been completed by comparing a reference voltage corresponding to the total number of memory cells included in a selected physical page with a verify voltage based on a verify data bit QS_BIT corresponding to the number of program-completed memory cells (including a memory cell corresponding to an erased state) among the memory cells included in the selected physical page. In other words, during the overall state current sensing operation, the current sensing circuit 160 may determine whether the program operation for all of the plurality of programmed states P1 to P7 has passed or failed, by comparing the verify voltage determined depending on the number of program-passed memory cells among all memory cells included in the selected physical page with the reference voltage.

Although FIG. 7 illustrates target programmed states of the triple-level cell, this is only for illustrative purposes. A plurality of memory cells included in the semiconductor memory device in accordance with an embodiment of the present disclosure each may be a multi-level cell (MLC). Alternatively, a plurality of memory cells included in the semiconductor memory device in accordance with an embodiment of the present disclosure each may be a quad-level cell (QLC).

Figure 8:
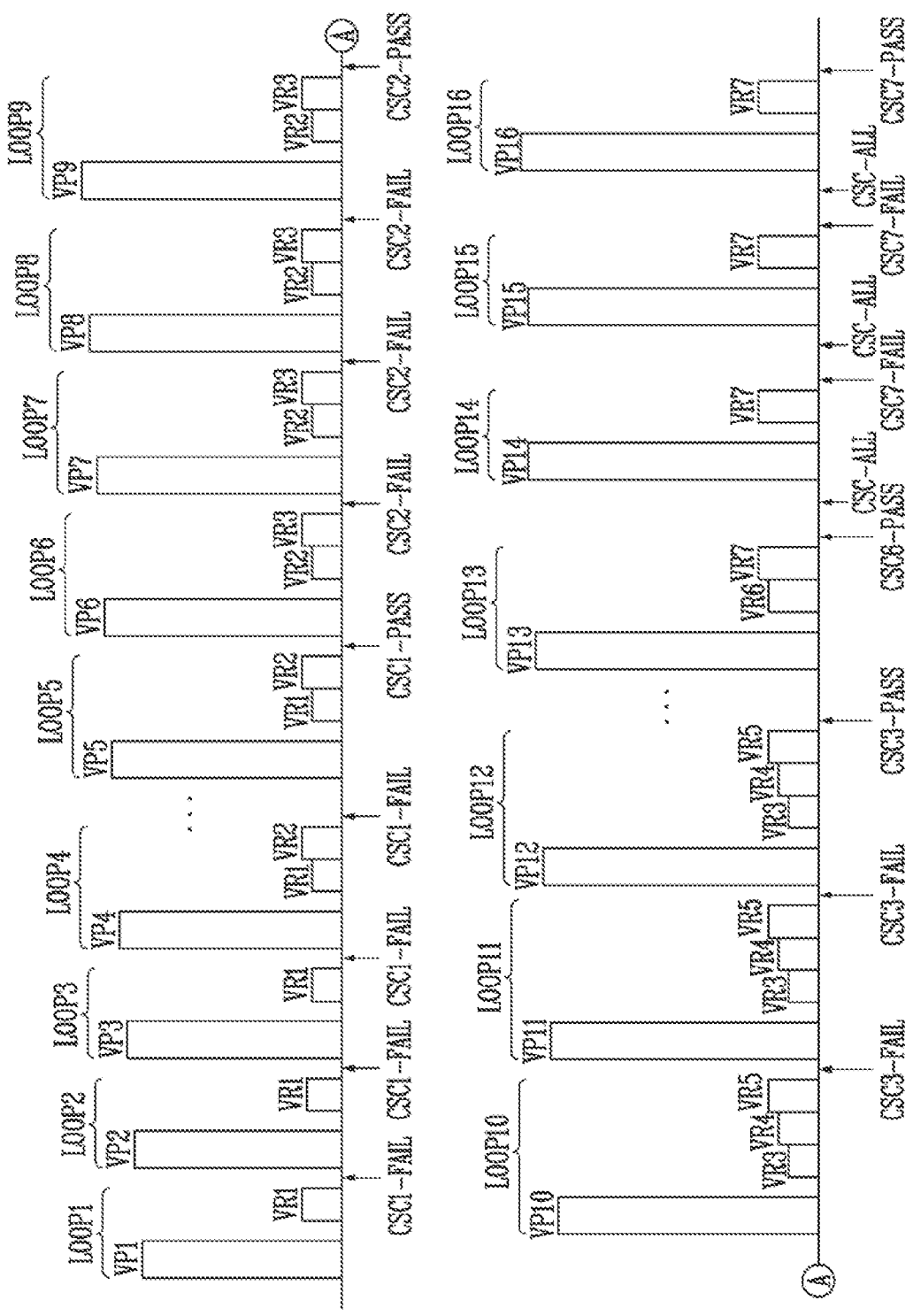
FIG. 8 is a diagram for describing a program operation based on an individual state current sensing operation and an overall state current sensing operation in accordance with an embodiment of the present disclosure.

FIG. 8 is a diagram for describing a program operation based on an individual state current sensing operation and an overall state current sensing operation in accordance with an embodiment of the present disclosure.

Referring to FIGS. 7 and 8, there is illustrated an example where a program operation for first to seventh programmed states P1 to P7 is performed in accordance with an embodiment of the present disclosure. During the program operation, a plurality of program loops LOOP1 to LOOP16 corresponding to the first to seventh programmed state P1 to P7 may be successively performed. For example, the program loops LOOP1 to LOOP5 may correspond to the first programmed state P1, and the program loops LOOP6 to LOOP9 may correspond to the second programmed state P2. The program loops LOOP10 to LOOP12 may correspond to the third programmed state P3. The program loop LOOP13 may correspond to the sixth programmed state P6. The program loops LOOP14 to LOOP16 may correspond to the seventh programmed state P7. Although FIG. 8 does not illustrate program loops corresponding to the fourth and fifth programmed states P4 and P5, non-illustration of some program loops is only for the sake of explanation. Substantially, it is preferable that program loops corresponding to the fourth and fifth programmed states P4 and P5 be disposed and performed between the program loop LOOP12 and the program loop LOOP13. Furthermore, additional program loops may be performed depending on a result of the overall state current sensing operation CSC-ALL that is performed after the program loop LOOP16.

Each of the plurality of program loops LOOP1 to LOOP16 may include a program pulse application operation and at least one verify operation. After each program loop has been performed, an individual state current sensing operation for a programmed state corresponding to the program loop may be performed.

This operation will be described more below.

During a program operation for the first programmed state P1 having a lowest threshold voltage distribution among the plurality of programmed states P1 to P7, the program loop LOOP1 may include performing an operation of applying a first program pulse VP1, and a verify operation using a verify voltage VR1 corresponding to the first programmed state P1, and then performing an individual state current sensing operation corresponding to the first programmed state P1. When a result of the individual state current sensing operation indicates a fail CSC1-FAIL, a subsequent program loop (e.g., LOOP2) for the first programmed state P1 may be performed. The program loop LOOP2 may include performing an operation of applying a second program pulse VP2 and a verify operation using the verify voltage VR1, and thereafter performing an individual state current sensing operation corresponding to the first programmed state P1. When a result of the individual state current sensing operation indicates a fail CSC1-FAIL, a subsequent program loop (e.g., LOOP3) for the first programmed state P1 may be performed. The program loop LOOP3 may include performing an operation of applying a third program pulse VP3 and a verify operation using the verify voltage VR1, and thereafter performing an individual state current sensing operation corresponding to the first programmed state P1. When a result of the individual state current sensing operation indicates a fail CSC1-FAIL, a subsequent program loop (e.g., LOOP4) for the first programmed state P1 may be performed. The program loop LOOP4 may include performing an operation of applying a fourth program pulse VP4 and a verify operation using the verify voltage VR1 and a verify voltage VR2 corresponding to the second programmed state P2, and thereafter performing an individual state current sensing operation corresponding to the first programmed state P1. When a result of the individual state current sensing operation indicates a fail CSC1-FAIL, a subsequent program loop for the first programmed state P1 may be performed. The program loop LOOP5 may include performing an operation of applying a fifth program pulse VP5 and a verify operation using the verify voltage VR1 and the verify voltage VR2, and thereafter performing an individual state current sensing operation corresponding to the first programmed state P1. When a result of the individual state current sensing operation indicates a pass CSC1-PASS, it may be determined that the program operation corresponding to the memory cells to be programmed to the first programmed state P1 has been completed, and the program loops LOOP6 to LOOP9 for a subsequent programmed state (e.g., the second programmed state P2) may be performed.

During a program operation for the second programmed state P2, the program loop LOOP6 may include performing an operation of applying a sixth program pulse VP6 and a verify operation using the second verify voltage VR2 corresponding to the second programmed state P2 and a verify voltage VR3 corresponding to the third programmed state P3, and thereafter performing an individual state current sensing operation corresponding to the second programmed state P2. When a result of the individual state current sensing operation indicates a fail CSC2-FAIL, a subsequent program loop for the second programmed state P2 may be performed. The program loop LOOP7 may include performing an operation of applying a seventh program pulse VP7 and a verify operation using the verify voltage VR2 and the verify voltage VR3, and thereafter performing an individual state current sensing operation corresponding to the second programmed state P2. When a result of the individual state current sensing operation corresponding to the second programmed state P2 indicates a fail CSC2-FAIL, a subsequent program loop LOOP8 may include an operation of applying an eighth program pulse VP8 and a verify operation using the verify voltage VR2 and the verify voltage VR3, and an individual state current sensing operation corresponding to the second programmed state P2. When a result of the individual state current sensing operation corresponding to the second programmed state P2 indicates a fail CSC2-FAIL, a subsequent program loop LOOP9 may include an operation of applying a ninth program pulse VP9 and a verify operation using the verify voltage VR2 and the verify voltage VR3, and an individual state current sensing operation corresponding to the second programmed state P2. When a result of the individual state current sensing operation corresponding to the second programmed state P2 indicates a pass CSC2-PASS, it may be determined that the program operation corresponding to the memory cells to be programmed to the second programmed state P2 has been completed, and the program loops LOOP10 to LOOP12 for a subsequent programmed state (e.g., the third programmed state P3) may be performed.

During a program operation for the third programmed state P3, the program loop LOOP10 may include performing an operation of applying a tenth program pulse VP10 and a verify operation using the third verify voltage VR3, a fourth verify voltage VR4 corresponding to the fourth programmed state P4, and a verify voltage VR5 corresponding to the fifth programmed state P5, and thereafter performing an individual state current sensing operation corresponding to the third programmed state P3. When a result of the individual state current sensing operation indicates a fail CSC3-FAIL, a subsequent program loop for the third programmed state P3 may be performed. The program loop LOOP11 may include performing an operation of applying an eleventh program pulse VP11 and a verify operation using the verify voltage VR3, the fourth verify voltage VR4, and the verify voltage VR5 corresponding to the fifth programmed state P5, and thereafter performing an individual state current sensing operation corresponding to the third programmed state P3. When a result of the individual state current sensing operation indicates a fail CSC3-FAIL, a subsequent program loop for the third programmed state P3 may be performed. The program loop LOOP12 may include performing an operation of applying a twelfth program pulse VP12 and a verify operation using the verify voltage VR3, the fourth verify voltage VR4, and the verify voltage VR5 corresponding to the fifth programmed state P5, and thereafter performing an individual state current sensing operation corresponding to the third programmed state P3. When a result of the individual state current sensing operation indicates a pass CSC3-PASS, it may be determined that the program operation corresponding to the memory cells to be programmed to the third programmed state P3 has been completed, and program loops for a subsequent programmed state (e.g., the fourth programmed state P4) may be performed.

In the program loop LOOP13 corresponding to the sixth programmed state P6, an operation of applying a thirteenth program pulse VP13 and a verify operation using a verify voltage VR6 corresponding to the sixth programmed state P6 and a verify voltage VR7 corresponding to the seventh programmed state P7 may be performed, and an individual state current sensing operation corresponding to the sixth programmed state P6 may be performed. When a result of the individual state current sensing operation corresponding to the sixth programmed state P6 indicates a pass CSC6-PASS, it may be determined that the program operation corresponding to the memory cells to be programmed to the sixth programmed state P6 has been completed, and the program loops LOOP14 to LOOP16 for a subsequent programmed state (e.g., the seventh programmed state P7) may be performed.

The program loop LOOP14 during a program operation for the seventh programmed state P7 may include performing an operation of applying a fourteenth program pulse VP14, and a verify operation using a verify voltage VR7, and thereafter performing an individual state current sensing operation corresponding to the seventh programmed state P7. When a result of the individual state current sensing operation indicates a fail CSC7-FAIL, a subsequent program loop for the seventh programmed state P7 may be performed. The program loop LOOP15 may include performing an operation of applying a fifteenth program pulse VP15 and a verify operation using the verify voltage VR7, and thereafter performing an individual state current sensing operation corresponding to the seventh programmed state P7. When a result of the individual state current sensing operation indicates a fail CSC7-FAIL, a subsequent program loop for the seventh programmed state P7 may be performed. The program loop LOOP16 may include performing an operation of applying a sixteenth program pulse VP16 and a verify operation using the verify voltage VR7, and thereafter performing an individual state current sensing operation corresponding to the seventh programmed state P7.

During the program operation including the plurality of program loops LOOP1 to LOOP16, the overall state current sensing operation CSC-ALL may be performed from a set program loop (e.g., LOOP13). For example, after the program loop LOOP13 has been performed, the individual state current sensing operation corresponding to the sixth programmed state P6 is performed, and the overall state current sensing operation CSC-ALL of determining whether the program operation for the overall programmed states P1 to P7 has been completed may be performed. After each program loop of the subsequent program loop LOOP14 to the last program loop is performed, the overall state current sensing operation CSC-ALL may be performed.

Figure 9:
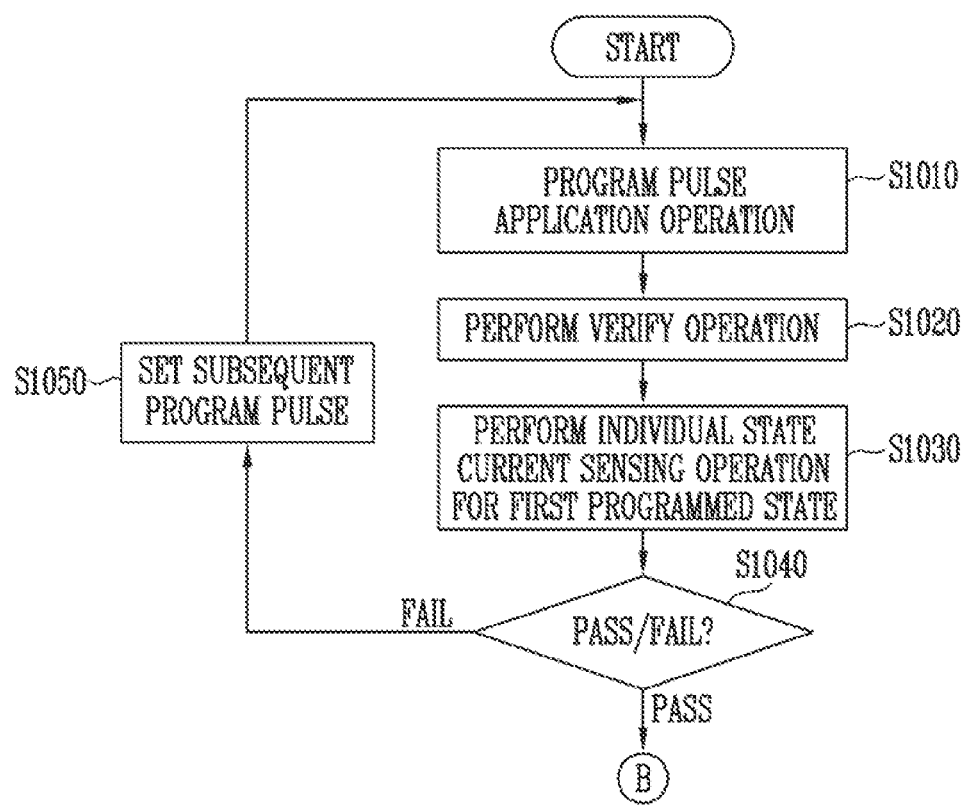
FIGS. 9 and 10 are flowcharts for describing a program operation and an individual state current sensing operation of the semiconductor memory device in accordance with an embodiment of the present disclosure.
Figure 10:
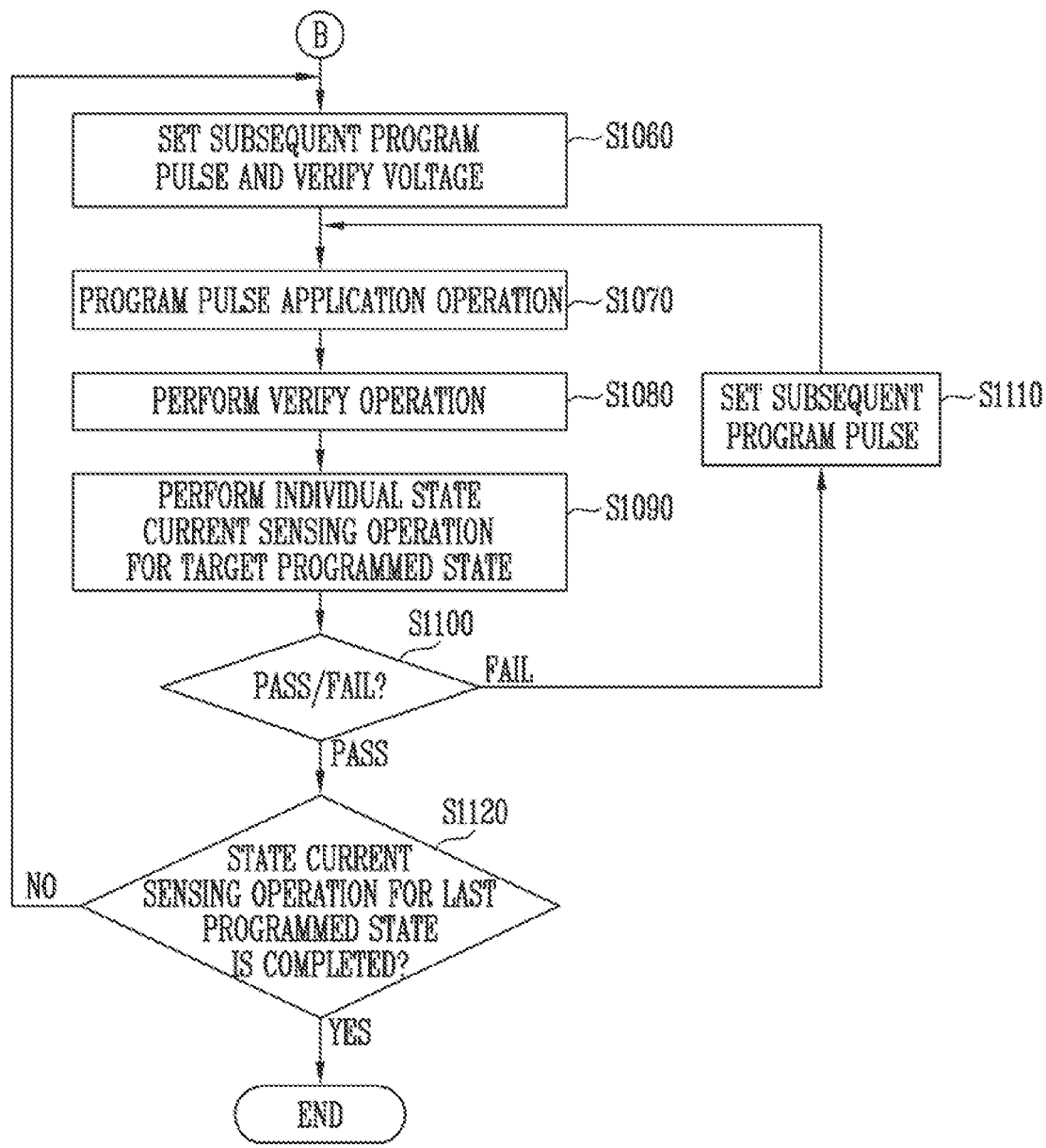

FIGS. 9 and 10 are flowcharts for describing a program operation and an individual state current sensing operation of the semiconductor memory device in accordance with an embodiment of the present disclosure.

The operation of the semiconductor memory device according to the embodiment of the present disclosure will be described with reference to FIGS. 1, 6 to 10.

In an embodiment of the present disclosure, there will be described an example where each of a plurality of memory cells is programmed to a plurality of programmed states P1 to P7, and respective program operations for the plurality of programmed states P1 to P7 are successively performed.

At step S1010, threshold voltages of memory cells coupled to a bit line to which a program enable voltage is applied may be increased by applying a program pulse to a selected word line to perform a program operation. For example, each of the page buffers PB1 to PBm of the read/write circuit 130 may temporarily store data DATA received from an external device and to be programmed, and control a potential level of a corresponding one of the bit lines BL1 to BLm based on the temporarily stored data DATA. The voltage generator 150 may generate a program voltage Vpgm and a pass voltage Vpass. The program voltage Vpgm may be a first program pulse VP1 of FIG. 8. The address decoder 120 may apply the program voltage Vpgm to the selected word line, and apply a pass voltage Vpass to unselected word lines. The first program pulse VP1 may be a start program pulse of an incremental step pulse program (ISPP).

At step S1020, the voltage generator 150 may generate a verify voltage Vverify and a pass voltage Vpass. The verify voltage Vverify may be a verify voltage VR1 of FIG. 8. The address decoder 120 may apply the verify voltage Vverify to the selected word line, and apply the pass voltage Vpass to the unselected word lines. Each of the plurality of page buffers PB1 to PBm of the read/write circuit 130 may perform a verify operation based on the amount of current of a corresponding one of the bit lines BL1 to BLm. Each of the plurality of page buffers PB1 to PBm may store a result of the verify operation in the sub-latch circuit 134 as verify data, and use a program inhibit voltage or a program enable voltage to control a corresponding bit line based on the verify data during a bit line set-up operation period. For example, based on the verify data stored in the sub-latch circuit 134, when it is determined that a program operation on a memory cell coupled to the corresponding bit line has been completed, the bit line controller 131 may apply the program inhibit voltage to the corresponding bit line, and when it is determined that the program operation on the memory cell coupled to the corresponding bit line is uncompleted, the bit line controller 131 may apply a program enable voltage to the corresponding bit line.

At step S1030, the current sensing circuit 160 may perform an individual state current sensing operation for the first programmed state. For example, the current sensing circuit 160 may generate verify current and verify voltage using a verify data bit QS_BIT based on the value of verify data stored in the sub-latch circuit 134 of each of page buffers in which data corresponding to the first programmed state and to be programmed is temporarily stored among the page buffers PB1 to PBm, determine whether the program operation corresponding to the first programmed state P1 has passed or failed by comparing the generated verify voltage with a reference voltage generated by the reference current, and generate and output a pass signal PASS or a fail signal FAIL.

Page buffers in which data corresponding to the first programmed state and to be programmed is temporarily stored among the page buffers PB1 to PBm may continuously maintain, when verify data corresponding to a program pass condition is latched, the same verify data in a subsequent program loop.

At step S1040, the control logic 140 may receive the pass signal PASS or the fail signal FAIL from the current sensing circuit 160 and determine whether the program operation corresponding to the first programmed state P1 has passed or failed.

When the control logic 140 determines that the program operation corresponding to the first programmed state P1 has failed (FAIL), at step S1050, the control logic 140 may set a program pulse to be used in a subsequent program loop. For example, the control logic 140 may set a new program pulse increased by a step voltage compared to the program pulse used in an immediately previous program loop, to a program pulse to be used in the subsequent program loop. Thereafter, the process may be re-performed from step S1010.

When the control logic 140 determines that the program operation corresponding to the first programmed state P1 has passed (PASS), at step S1060, the control logic 140 may set a program pulse to be used in a program loop corresponding to a subsequent programmed state (e.g., P2) and a verify voltage corresponding to the subsequent programmed state (e.g., P2).

At step S1070, the threshold voltages of the memory cells coupled to the bit line to which the program enable voltage is applied may be increased by applying the new-set program pulse to the selected word line. The voltage generator 150 may generate the new-set program pulse and a pass voltage Vpass. The address decoder 120 may apply the program pulse generated from the voltage generator 150 to the selected word line, and apply the pass voltage Vpass to the unselected word lines.

At step S1080, the voltage generator 150 may generate at least one new-set verify voltage and a pass voltage Vpass. The address decoder 120 may apply the verify voltage Vverify to the selected word line, and apply the pass voltage Vpass to the unselected word lines. Each of the plurality of page buffers PB1 to PBm of the read/write circuit 130 may perform a verify operation based on the amount of current of a corresponding one of the bit lines BL1 to BLm. Each of the plurality of page buffers PB1 to PBm may store a result of the verify operation in the sub-latch circuit 134 as verify data, and use a program inhibit voltage or a program enable voltage to control a corresponding bit line based on the verify data during a bit line set-up operation period. For example, based on the verify data stored in the sub-latch circuit 134, when it is determined that a program operation on a memory cell coupled to the corresponding bit line has been completed, the bit line controller 131 may apply the program inhibit voltage to the corresponding bit line, and when it is determined that the program operation on the memory cell coupled to the corresponding bit line is uncompleted, the bit line controller 131 may apply a program enable voltage to the corresponding bit line.

Page buffers in which data corresponding to the subsequent programmed state and to be programmed is temporarily stored among the page buffers PB1 to PBm may continuously maintain, when verify data corresponding to a program pass condition is latched, the same verify data in a subsequent program loop.

At step S1090, the current sensing circuit 160 may perform an individual state current sensing operation for the subsequent programmed state (e.g., P2) For example, the current sensing circuit 160 may generate verify current and verify voltage using a verify data bit QS_BIT based on the value of verify data stored in the sub-latch circuit 134 of each of page buffers in which data corresponding to the subsequent programmed state and to be programmed is temporarily stored among the page buffers PB1 to PBm, determine whether the program operation corresponding to the subsequent programmed state (e.g., P2) has passed or failed by comparing the generated verify voltage with a reference voltage generated by the reference current, and generate and output a pass signal PASS or a fail signal FAIL.

At step S1100, the control logic 140 may receive the pass signal PASS or the fail signal FAIL from the current sensing circuit 160 and determine whether the program operation corresponding to the subsequent programmed state (e.g., P2) has passed or failed.

When the control logic 140 determines that the program operation corresponding to the subsequent programmed state (e.g., P2) has failed (FAIL), at step S1110, the control logic 140 may set a program pulse to be used in a subsequent program loop. For example, the control logic 140 may set a new program pulse increased by a step voltage compared to the program pulse used in an immediately previous program loop, to a program pulse to be used in the subsequent program loop. Thereafter, the process may be re-performed from step S1070.

When the control logic 140 determines that the program operation corresponding to the subsequent programmed state (e.g., P2) has passed (PASS), at step S1120, the control logic 140 may check whether the individual state current sensing operation that has been performed from step S1090 to the present step is an individual state current sensing operation for the last programmed state (e.g., P7). For example, if it is determined that the individual state current sensing operation for the last programmed state (e.g. P7) has not been performed to the present step (as designated by "NO"), the process may be re-performed from above-described step S1060. For example, if it is determined that the individual state current sensing operation for the last programmed state (e.g. P7) has been performed to the present step (as designated by "YES"), the process may be terminated.

Figure 11:
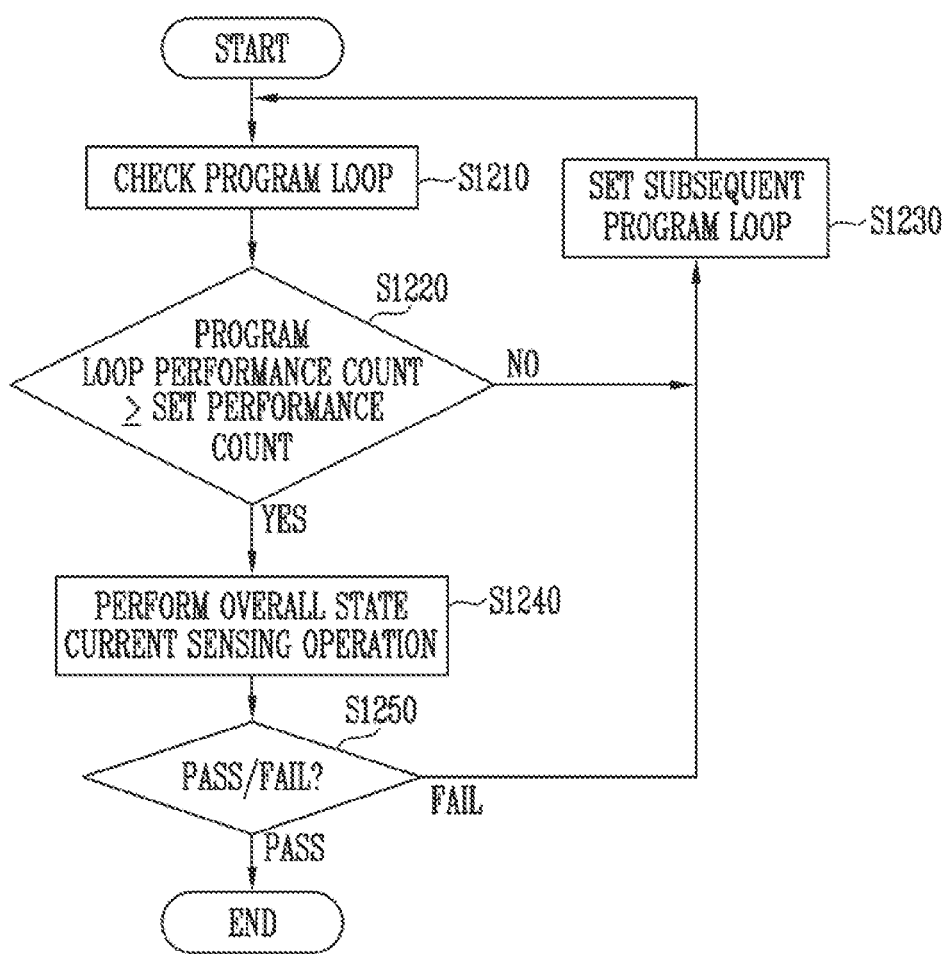
FIG. 11 is a flowchart for describing an overall state current sensing operation of the program operation of the semiconductor memory device in accordance with the embodiment of FIGS. 9 and 10.

FIG. 11 is a flowchart for describing an overall state current sensing operation of the program operation of the semiconductor memory device in accordance with the embodiment of FIGS. 9 and 10.

The overall state current sensing operation of the semiconductor memory device will be described below with reference to FIG. 11.

At step S1210, the number of times the program loops have been performed may be checked. The program loops may be counted by the control logic 140 of FIG. 1.

At step S1220, it may be determined whether the number of times the program loops have been performed is a set count or more.

At above-described step S1220, if the number of times the program loops have been performed is less than the set count, a subsequent program loop may be performed at step S1230, and the process may be re-performed from above-described step S1210.

At above-described step S1220, if the number of times the program loops have been performed is equal to or greater than the set count, an overall state current sensing operation may be performed, at step S1240. For example, the sub-latch circuit 134 of each of the page buffers PB1 to PBm may continuously latch verify data corresponding to one programmed state of the plurality of programmed states P1 to P7. The current sensing circuit 160 may generate verify current and verify voltage using a verify data bit QS_BIT based on the value of the verify data stored in the sub-latch circuit 134 included in each of the page buffers PB1 to PBm, and determine whether a program operation corresponding to the overall target programmed states P1 to P7 has passed by comparing the generated verify voltage with a reference voltage generated by the reference current. For example, when, during an overall state current sensing operation, the number of program-failed memory cells among n memory cells to be programmed to a plurality of programmed states (e.g., among memory cells included in one page) is a preset number or less, the current sensing circuit 160 may determine that the program operation for the overall programmed state has passed, and output a pass signal PASS. When, during the overall state current sensing operation, the number of program-failed memory cells among n memory cells to be programmed to the overall programmed states is greater than a preset number, the current sensing circuit 160 may determine that the program operation for the overall programmed states has failed, and output a fail signal FAIL.

At step S1250, the control logic 140 may receive a pass signal PASS or a fail signal FAIL from the current sensing circuit 160 and determine whether the program operation corresponding to the overall programmed states has passed or faded. For example, when the fail signal FAIL is received from the current sensing circuit 160 (as designated by "FAIL"), the process may be re-performed from above-described step S1230. In an embodiment, when a result of the overall state current sensing operation indicates that the program operation has failed, the control logic controls the peripheral circuit to perform a new program loop including the bit line set-up operation, the program pulse application operation, and the verify operation on the selected memory cells. When the pass signal PASS is received from the current sensing circuit 160, the program operation may be terminated.

In an embodiment of the present disclosure, at step S1240, an operation period of the overall state current sensing operation of the current sensing circuit 160 may overlap with an operation period of the bit line set-up operation of page buffers that store verify data corresponding to the program fail among the page buffers PB1 to PBm before a program pulse is applied to a selected word line. This will be explained more in the following description with reference to FIG. 12.

Figure 12:
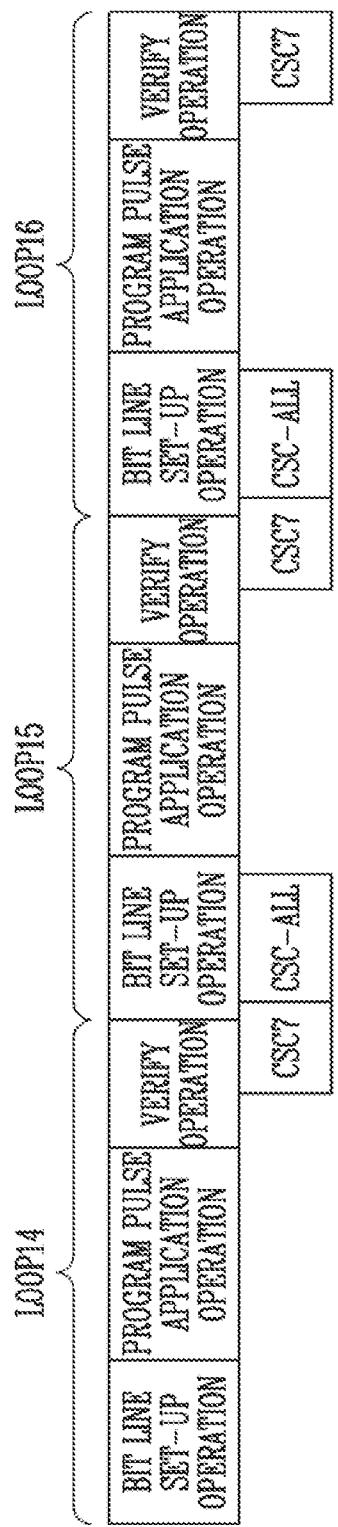
FIG. 12 is a diagram for describing an operation time overlap of a bit line set-up operation and the overall current sensing operation.

FIG. 12 is a diagram for describing an operation time overlap of the bit line set-up operation and the entire current sensing operation.

Referring to FIGS. 8 and 10 to 12, to program memory cells to a seventh programmed state P7 in the program loop LOOP14, each of the page buffers PB1 to PBm may perform a bit line set-up operation of applying a program inhibit voltage or a program enable voltage to a corresponding bit line, and perform a program pulse application operation of applying a set program pulse. Thereafter, a verify operation using the verify voltage VR7 corresponding to the seventh programmed state may be performed.

Subsequently, at step S1090, an individual state current sensing operation CSC7 corresponding to the seventh programmed state P7 may be performed. An operation period of the the individual state current sensing operation CSC7, may partially overlap with an operation period of a verify operation.

If the individual state current sensing operation is completed, an overall state current sensing operation CSC-ALL may be performed, at step S1240.

In a period in which the overall state current sensing operation CSC-ALL is performed, the control logic 140 may control the page buffers PB1 to PBm of the read/write circuit 130 and thus perform a bit line set-up operation corresponding to a subsequent program loop LOOP15 (i.e., new program loop). The program loop LOOP15 may be an additional program operation. For example, in the program loop LOOP15, each of the page buffers PB1 to PBm may perform a bit line set-up operation of applying a program inhibit voltage or a program enable voltage to a corresponding bit line based on verify data stored in the sub-latch circuit 134. Here, the operation period of the bit line set-up operation and a portion or the entirety of the operation period of the overall state current sensing operation CSC-ALL of the current sensing circuit 160 may overlap with each other. In an embodiment, for example, if the bit line set-up operation takes place over a first interval of time and the overall state current sensing operation CSC-ALL takes place over a second interval of time, then the first and second intervals at least partially overlap each other such that there exits a time at which the bit line set-up operation and the overall state current sensing operation CSC-ALL are both taking place.

Subsequently, the control logic 140 may control the peripheral circuit and thus apply a program voltage to a selected word line, and then perform a verify operation on corresponding memory cells. Thereafter, the current sensing circuit 160 may perform the overall state current sensing operation CSC-ALL. In a period in which the overall state current sensing operation CSC-ALL is performed, the control logic 140 may control the page buffers PB1 to PBm of the read/write circuit 130 and thus perform a bit line set-up operation corresponding to a subsequent program loop LOOP16. The program loop LOOP16 may be an additional program operation.

In an embodiment of the present disclosure, as described above, after the last individual state current sensing operation has been performed, an operation period of the overall state current sensing operation and a partial period or an overall period of the bit line set-up operation may overlap with each other. Thereby, a program operation time of the semiconductor memory device may be reduced.

Figure 13:
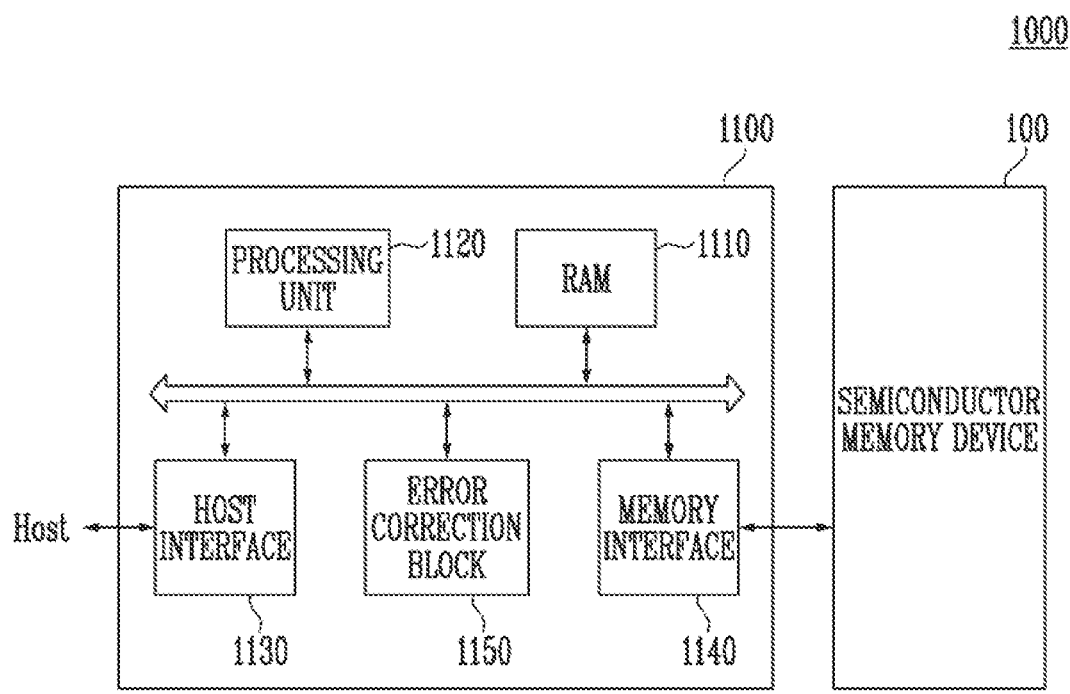
FIG. 13 is a block diagram illustrating an embodiment (1000) of a memory system including the semiconductor memory device of FIG. 1.

FIG. 13 is a block diagram illustrating an embodiment (1000) of a memory system including the semiconductor memory devices of FIG. 1.

Referring FIG. 13, a memory system 1000 may include a semiconductor memory device 100 and a controller 1100. The semiconductor memory device 100 may be the semiconductor memory devices described with reference to FIG. 1. Hereinafter, repetitive explanations will be omitted.

The controller 1100 is coupled to a host and the semiconductor memory device 100. The controller 1100 may access the semiconductor memory device 100 in response to a request from the host. For example, the controller 1100 may control a read operation, a write operation, an erase operation, and a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operating memory for the processing unit 1120, a cache memory between the semiconductor memory device 100 and the host, and a buffer memory between the semiconductor memory device 100 and the host. The processing unit 1120 may control the overall operation of the controller 1100. In addition, the controller 1100 may temporarily store program data provided from the host during the program operation.

The host interface 1130 may include a protocol for performing data exchange between the host and the controller 1100. In an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1140 may interface with the semiconductor memory device 100. For example, the memory interface may include a NAND interface or a NOR interface.

The error correction block 1150 may use an error correcting code (ECC) to detect and correct an error in data received from the semiconductor memory device 100. The processing unit 1120 may control the semiconductor memory device 100 to adjust the read voltage according to an error detection result from the error correction block 1150 and perform re-reading. In an embodiment, the error correction block 1250 may be provided as a component of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick, multimedia card (MMC, RS-MMC, or MMCmicro), a SD card (SD, miniSD, microSD, or SDHC), and a universal flash storage (UFS).

The controller 1100 and the semiconductor memory device 100 may be integrated into a single semiconductor device to form a solid state drive (SSD). The SSD may include a storage device configured to store data in a semiconductor memory. When the memory system 1000 is used as the SSD, the operating speed of the host coupled to the memory system 2000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 14:
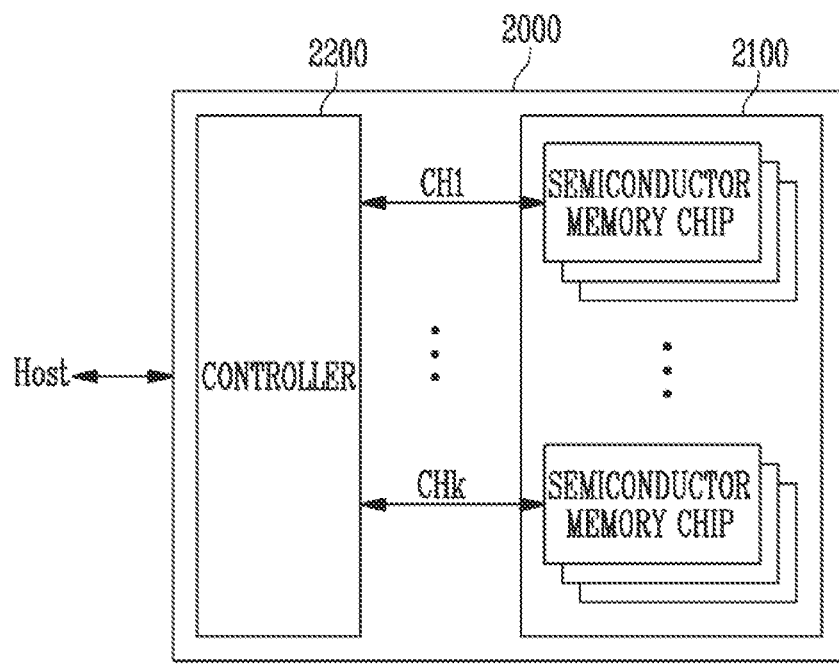
FIG. 14 is a block diagram illustrating an example of application of the memory system of FIG. 13.

FIG. 14 is a block diagram illustrating an example of application of the memory system of FIG. 13.

Referring to FIG. 14, the memory system 2000 may include the semiconductor memory device 2100 and a controller 2200. The semiconductor memory device 2100 may include a plurality of semiconductor memory chips. The semiconductor memory chips are divided into a plurality of groups.

In FIG. 14, it is illustrated that the respective groups communicate with the controller 2200 through first to k-th channels CH1 to CHk. Each semiconductor memory chip may be configured and operated in the same manner as those of the semiconductor memory devices 100 described with reference to FIG. 1.

Each group may communicate with the controller 2200 through one common channel. The controller 2200 may have the same configuration as that of the controller 1100 described with reference to FIG. 14 and control a plurality of memory chips of the semiconductor memory device 2100 through the plurality of channels CH1 to CHk.

Figure 15:
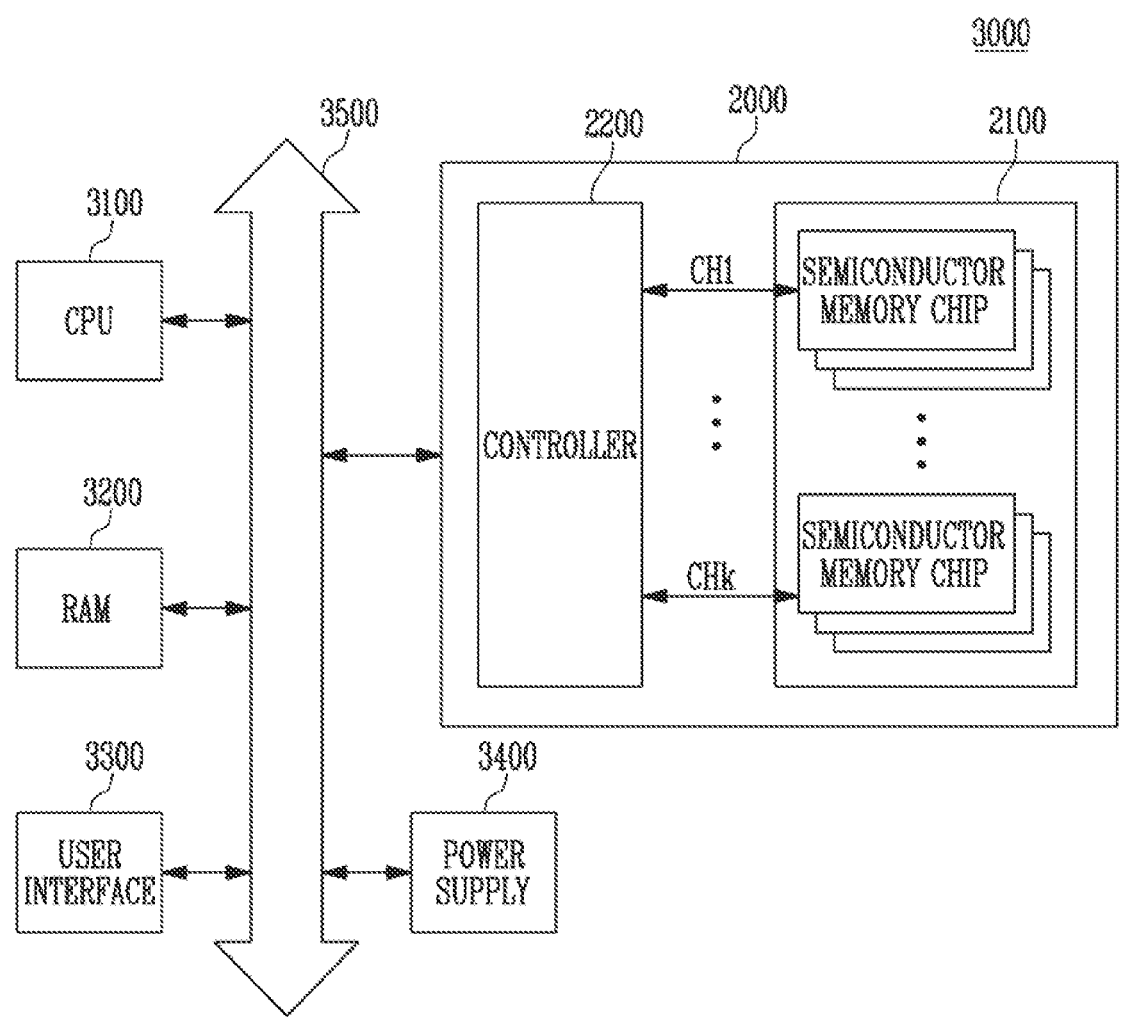
FIG. 15 is a block diagram showing a computing system including the memory system illustrated with reference to FIG. 14.

FIG. 15 is a block diagram showing a computing system including the memory system illustrated with reference to FIG. 14.

The computing system 3000 may include a central processing unit (CPU) 3100, a RAM 3200, a user interface 3300, a power supply 3400, a system bus 3500, and the memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 15, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 15, the memory system 2000 described with reference to FIG. 14 is illustrated as being used. In an embodiment, the memory system 2000 may be replaced with the memory system 1000 described with reference to FIG. 13. In an embodiment, the computing system 3000 may include all of the memory systems 1000 and 2000 described with reference to FIGS. 14 and 13.

In various embodiments of the present disclosure, during a program operation of a semiconductor memory device, an operation period of a bit line set-up operation and an operation period of a program verify operation may overlap with each other, so that a program operation time may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a memory cell array comprising a plurality of memory cells to be programmed to a plurality of programmed states;
a peripheral circuit configured to perform a program operation including a program voltage application operation and a program verify operation on selected memory cells among the plurality of memory cells;
a current sensing circuit configured to perform an individual state current sensing operation and an overall state current sensing operation on the selected memory cells among the plurality of memory cells and determine a result of the program operation for each of the plurality of programmed states by comparing a verify voltage based on a result of the program verify operation with a reference voltage during the individual state current sensing operation and the overall state current sensing operation; and
control logic configured to control the peripheral circuit and the current sensing circuit such that an operation period of the overall state current sensing operation at least partially overlaps with an operation period of a bit line set-up operation for adjusting potential levels of bit lines of the memory cell array for the program voltage application operation.

2. The semiconductor memory device according to claim 1, wherein the peripheral circuit performs the program operation including a plurality of program loops, and each of the plurality of program loops includes the bit line set-up operation, a program pulse application operation, and a verify operation.

3. The semiconductor memory device according to claim 2, wherein the peripheral circuit comprises a read/write circuit configured to apply at least one of a program inhibit voltage and a program enable voltage to the bit lines of the memory cell array depending on data to be programmed during the bit line set-up operation.

4. The semiconductor memory device according to claim 3, wherein the read/write circuit latches verify data corresponding to the selected memory cells during the verify operation, and applies at least one of the program inhibit voltage and the program enable voltage to the bit lines based on the verify data during the bit line set-up operation that is performed after the verify operation.

5. The semiconductor memory device according to claim 4, wherein the read/write circuit generates a verify data bit based on the verify data latched after the verify operation.

6. The semiconductor memory device according to claim 5, wherein the current sensing circuit performs the individual state current sensing operation based on the verify data bit after the verify operation of each of the plurality of program loops.

7. The semiconductor memory device according to claim 6, wherein, during the individual state current sensing operation, when a number of program-failed memory cells among memory cells to be programmed to any one programmed state of the plurality of programmed states is a first set number or less, the current sensing circuit determines that the program operation for the any one programmed state has passed, and when the number of program-failed memory cells is greater than the first set number, the current sensing circuit determines that the program operation for the any one programmed state has failed.

8. The semiconductor memory device according to claim 7, wherein the current sensing circuit performs the overall state current sensing operation when a number of times the program loops have been performed is a set count or more.

9. The semiconductor memory device according to claim 8, wherein, during the overall state current sensing operation, when a number of program-failed memory cells among the selected memory cells is a second set number or less, the current sensing circuit determines that the program operation on the selected memory cells has passed, and when the number of program-failed memory cells is greater than the second set number, the current sensing circuit determines that the program operation on the selected memory cells has failed.

10. The semiconductor memory device according to claim 9, wherein, when a result of the overall state current sensing operation indicates that the program operation has failed, the control logic controls the peripheral circuit to perform a new program loop including the bit line set-up operation, the program pulse application operation, and the verify operation on the selected memory cells.

11. The semiconductor memory device according to claim 10, wherein the control logic controls the peripheral circuit and the current sensing circuit to overlap the operation period of the overall state current sensing operation with the operation period of the bit line set-up operation of the new program loop.

12. The semiconductor memory device according to claim 10, wherein the current sensing circuit re-performs the overall state current sensing operation after the new program loop is performed.

13. A method of operating a semiconductor memory device, comprising:
performing a first program operation corresponding to a first programmed state of a plurality of programmed states;
performing a first individual state current sensing operation corresponding to the first program operation and determining whether the first program operation has passed;
performing a second program operation corresponding to a second programmed state having a threshold voltage distribution higher than a threshold voltage distribution of the first programmed state based on a result of the first individual state current sensing operation;
performing a second individual state current sensing operation corresponding to the second program operation and determining whether the second program operation has passed;
performing an overall state current sensing operation; and
performing, when a result of the overall state current sensing operation indicates a fail, an additional program operation and then re-performing the process from the overall state current sensing operation,
wherein an operation period of the overall state current sensing operation and an operation period of the additional program operation at least partially overlap with each other.

14. The method according to claim 13, wherein each of the first program operation, the second program operation, and the additional program operation comprises a bit line set-up operation, a program pulse application operation, and a verify operation.

15. The method according to claim 14, wherein the operation period of the overall state current sensing operation and the operation period of the additional program operation overlap with each other.

16. The method according to claim 13, wherein, during the first individual state current sensing operation, when a number of program-failed memory cells among memory cells to be programmed to the first programmed state is a first set number or less, the first program operation is determined to have passed, and when the number of program-failed memory cells is greater than the first set number, the first program operation is determined to have failed.

17. The method according to claim 13, wherein during the second individual state current sensing operation, when a number of program-failed memory cells among memory cells to be programmed to the second programmed state is a second set number or less, the second program operation is determined to have passed, and when the number of program-failed memory cells is greater than the second set number, the second program operation is determined to have failed.

18. The method according to claim 13, wherein during the overall state current sensing operation, when a number of program-failed memory cells among all memory cells to be programmed to the first programmed state and the second programmed state is a third set number or less, a program operation on the all memory cells is determined to have passed, and when the number of program-failed memory cells is greater than the third set number, the program operation on the all memory cells is determined to have failed.

19. The method according to claim 14, wherein the overall state current sensing operation is performed when a number of times program loops each including the bit line set-up operation, the program pulse application operation, and the verify operation have been performed is a set count or more.

* * * * *